US012684982B2

(12) United States Patent
Xu et al.

(10) Patent No.: US 12,684,982 B2
(45) Date of Patent: Jul. 14, 2026

(54) PIXEL ARRANGEMENT STRUCTURE, FINE METAL MASK SET AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Qian Xu, Beijing (CN); Peng Xu, Beijing (CN); Lujiang Huangfu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 329 days.

(21) Appl. No.: 18/015,513

(22) PCT Filed: Oct. 22, 2021

(86) PCT No.: PCT/CN2021/125606
§ 371 (c)(1),
(2) Date: Jan. 10, 2023

(87) PCT Pub. No.: WO2022/134815
PCT Pub. Date: Jun. 30, 2022

(65) Prior Publication Data
US 2023/0345788 A1      Oct. 26, 2023

(30) Foreign Application Priority Data
Dec. 25, 2020    (CN) ........................ 202011565078.X

(51) Int. Cl.
*G06V 40/13*        (2022.01)
*C23C 14/04*        (2006.01)
(Continued)

(52) U.S. Cl.
CPC ......... *H10K 59/353* (2023.02); *C23C 14/042* (2013.01); *H10K 59/352* (2023.02); *H10K 71/166* (2023.02); *G09G 2300/0452* (2013.01)

(58) Field of Classification Search
None
See application file for complete search history.

(56) References Cited

U.S. PATENT DOCUMENTS

2011/0260951 A1* 10/2011 Hwang ............. G02F 1/134336
345/55
2013/0309688 A1* 11/2013 Barker .................... B01F 31/65
435/7.1
(Continued)

FOREIGN PATENT DOCUMENTS

CN        104766875 A      7/2015
CN        104885141 A      9/2015
(Continued)

OTHER PUBLICATIONS

PCT/CN2021/125606 international search report.
PCT/CN2021/125606 Written Opinion.

*Primary Examiner* — Joseph R Haley
(74) *Attorney, Agent, or Firm* — IPro, PLLC

(57)                    ABSTRACT

The present disclosure provides a pixel arrangement structure, a fine metal mask set and a display apparatus. The pixel arrangement structure includes a plurality of sub-pixel repetition units along a first direction or a second direction. The plurality of sub-pixel repetition units each form a plurality of pixel units. The sub-pixel repetition units each include one or more first color sub-pixels, one or more second color sub-pixels and one or more third color sub-pixels. Each of the first color sub-pixels and each of the second color sub-pixels independently belong to one pixel unit respec- (Continued)

tively, and each of the third color sub-pixels is shared by two pixel units. The first direction intersects with the second direction.

17 Claims, 6 Drawing Sheets

(51) Int. Cl.
  *H10K 59/35* (2023.01)
  *H10K 71/16* (2023.01)

(56) References Cited

U.S. PATENT DOCUMENTS

| | | |
|---|---|---|
| 2016/0240593 A1 | 8/2016 | Gu et al. |
| 2017/0116900 A1 | 4/2017 | Chaji |
| 2017/0309688 A1* | 10/2017 | Lee ...................... H10K 59/352 |
| 2018/0286929 A1* | 10/2018 | Li ........................... H10K 50/13 |
| 2020/0075691 A1* | 3/2020 | Zhou ...................... H10K 59/35 |
| 2023/0098247 A1 | 3/2023 | Cui |

FOREIGN PATENT DOCUMENTS

| | | |
|---|---|---|
| CN | 106449710 A | 2/2017 |
| CN | 106935616 A | 7/2017 |
| CN | 107871759 A | 4/2018 |
| CN | 207503982 U | 6/2018 |
| CN | 109427851 A | 3/2019 |
| CN | 111599942 A | 8/2020 |
| CN | 111697025 A | 9/2020 |
| CN | 112599584 A | 4/2021 |

* cited by examiner (a)

(b)

(c)

PIXEL ARRANGEMENT STRUCTURE, FINE METAL MASK SET AND DISPLAY APPARATUS

CROSS REFERENCE TO RELATED APPLICATIONS

This application is a US national phase of PCT application No. PCT/CN2021/125606 filed on Oct. 22, 2021, which claims priority to Chinese Patent Application No. 202011565078.X filed on Dec. 25, 2020, the entire content of which is incorporated herein by reference.

TECHNICAL FIELD

The present disclosure relates to the field of display technologies, and in particular to a pixel arrangement structure, a fine metal mask set and a display apparatus.

BACKGROUND

A light-emitting layer in a display device structure of Organic Light-Emitting Diode (OLED) is usually prepared by evaporation with a fine metal mask (FMM), that is, by evaporating R/G/B (red/green/blue) organic light-emitting materials using an FMM onto positions of sub-pixels of corresponding colors on an array substrate. At present, as people have higher and higher requirements for a resolution of display apparatuses, higher and higher requirements are also proposed for pixel arrangement structures and fine metal masks for forming the pixel arrangement structures.

SUMMARY

The present disclosure is made based on discovery and recognition of the inventor for the following facts and problems.

As mentioned above, people now have higher and higher requirements for the resolution of the display apparatuses. Limited by level and costs of FMM evaporation process, it is difficult to achieve higher resolution by reducing pixel size and inter-pixel distance.

One common way to improve the resolution of the display apparatuses is sub-pixel rendering (SPR) technology by which sub-pixels of some positions are shared between different pixels to achieve higher resolution through simulation by using fewer sub-pixels, for example, by using a pixel arrangement structure of RGBG type such as a common diamond arrangement (as shown in FIG. 7). With RGB pixels as an example, as shown in FIG. 7, different from the fact that two pixels in a true red/green/blue pixel arrangement include six sub-pixels (i.e. each pixel includes three complete sub-pixels R sub-pixel, G sub-pixel and B sub-pixel), two pixels in the pixel arrangement structure of RGBG type such as diamond arrangement only include four sub-pixels, where, except that each G sub-pixel expresses g signals in the true RGB in a one-to-one manner, the R sub-pixel and the B sub-pixel need to adopt the sub-pixel rendering (SPR) technology to represent r and b signals in two true red/green/blue pixels based on algorithm of sharing of left-right adjacent virtual pixels of same row. The inventor finds that the above pixel arrangement structure (RGBG pixel arrangement structure) can reduce the number of sub-pixels, lower the process complexity and help achieve high pixels per inch (PPI). But, the reduced number of the sub-pixels will inevitably result in loss of partial picture information. Through researches, the inventor finds that the sub-pixels of only one color can be borrowed/shared. For example, a R or B sub-pixel is added on the basis of RGBG, for example, the number of R sub-pixels is increased and only B sub-pixels are borrowed in a smallest unit group (i.e. smallest repetition unit). In this way, the resolution can be increased by the SPR algorithm and partial picture loss resulting from fewer sub-pixels can be compensated for to some extent, thus increasing display effect.

In view of the above, according to one aspect of the present disclosure, there is provided a pixel arrangement structure. The pixel arrangement structure includes a plurality of sub-pixel repetition units along a first direction or a second direction, and the plurality of sub-pixel repetition units each form a plurality of pixel units. The sub-pixel repetition units each include one or more first color sub-pixels, one or more second color sub-pixels and one or more third color sub-pixels. Each of the first color sub-pixels and each of the second color sub-pixels independently belong to one pixel unit respectively, and each of the third color sub-pixels is shared by two pixel units. The first direction intersects with the second direction. Hence, in the pixel arrangement structure, only the third color sub-pixels are shared by two pixel units based on sub-pixel rendering technology. Such pixel arrangement structures can achieve a high resolution by a reduced physical resolution and can effectively compensate partial picture loss resulting from fewer sub-pixels, thus helping to improve the display effect.

In one or more embodiments of the present disclosure, each of the sub-pixel repetition units includes two first color sub-pixels, two second color sub-pixels and one third color sub-pixel. Each of the sub-pixel repetition units includes two pixel units. In each of the sub-pixel repetition units, the third color sub-pixel is shared by the two pixel units and there is no shared sub-pixel between different sub-pixel repetition units.

In one or more embodiments of the present disclosure, the two pixel units in each of the sub-pixel repetition units are in mirror symmetry.

In one or more embodiments of the present disclosure, a distance between two adjacent sub-pixels of same color is shorter than a distance between two adjacent sub-pixels of different colors.

In one or more embodiments of the present disclosure, the sub-pixel repetition units are rectangular with a size ratio of a length side to a width side being 1.5:1 to 2.5:1, where a size of the width side is 30 to 100 microns and a size of the length side is 45 to 250 microns.

In one or more embodiments of the present disclosure, one of the following conditions is satisfied: a size of one pixel unit along the first direction is D1, and two sub-pixel repetition units that are adjacent along the second direction are misaligned with a misaligned distance being 0 to D1; or, a size of one pixel unit along the second direction is D2, and two sub-pixel repetition units that are adjacent along the first direction are misaligned with a misaligned distance being 0 to D2.

In one or more embodiments of the present disclosure, an area of one third color sub-pixel is 1 to 3 times an area of one first color sub-pixel or an area of one second color sub-pixel.

In one or more embodiments of the present disclosure, a length direction of the third color sub-pixels is consistent with an arrangement direction of the pixel units in the sub-pixel repetition units.

In one or more embodiments of the present disclosure, a length direction of the third color sub-pixels is parallel to at least one of a length direction of the first color sub-pixels and a length direction of the second color sub-pixels, or the length direction of the third color sub-pixels is perpendicular to at least one of the length direction of the first color sub-pixels and the length direction of the second color sub-pixels.

In one or more embodiments of the present disclosure, in each of the sub-pixel repetition units, each of the third color sub-pixels is located between two of the first color sub-pixels.

In one or more embodiments of the present disclosure, in the sub-pixel repetition units arranged along the first direction, two second color sub-pixels are located between two first color sub-pixels, and the two second color sub-pixels are disposed side by side along the first direction.

In one or more embodiments of the present disclosure, the third color sub-pixel and the two second color sub-pixels are arranged top and bottom along the second direction.

In one or more embodiments of the present disclosure, along the first direction, two first color sub-pixels in two adjacent sub-pixel repetition units are disposed adjacent to each other.

In one or more embodiments of the present disclosure, in each of the sub-pixel repetition units arranged along the second direction, the third color sub-pixel is located between the two second color sub-pixels.

In one or more embodiments of the present disclosure, the two first color sub-pixels are located in a first sub-pixel column along the second direction, the two second color sub-pixels are located in a second sub-pixel column along the second direction, and the third color sub-pixel is located between the first sub-pixel column and the second sub-pixel column.

In one or more embodiments of the present disclosure, in each of the sub-pixel repetition units, the first color sub-pixel and the second color sub-pixel at a same side of the third color sub-pixel are located in a same sub-pixel row.

In one or more embodiments of the present disclosure, the one or more first color sub-pixels are red sub-pixels, the one or more second color sub-pixels are green sub-pixels, and the one or more third color sub-pixels are blue sub-pixels.

According to another aspect of the present disclosure, there is provided a fine metal mask set for preparing the above pixel arrangement structure. The fine metal mask set includes a first fine metal mask, a second fine metal mask and a third fine metal mask. The first fine metal mask has a plurality of first apertures for forming the first color sub-pixels through evaporation, and each of the first apertures forms two first color sub-pixels through evaporation; the second fine metal mask has a plurality of second apertures for forming the second color sub-pixels through evaporation, and each of the second apertures forms two second color sub-pixels; the third fine metal mask has a plurality of third apertures for forming the third color sub-pixels through evaporation. Hence, it is favorable for reducing preparation difficulty of the fine metal masks and further lowering preparation costs.

In one or more embodiments of the present disclosure, when forming the sub-pixel repetition units arranged along the first direction, two second color sub-pixels in each of the sub-pixel repetition units are formed through one second aperture; two adjacent first color sub-pixels in two adjacent sub-pixel repetition units are formed through one first aperture.

In one or more embodiments of the present disclosure, when forming the sub-pixel repetition units arranged along the second direction, two adjacent first color sub-pixels in two adjacent sub-pixel repetition units are formed through one first aperture, and two adjacent second color sub-pixels in two adjacent sub-pixel repetition units are formed through one second aperture.

According to another aspect of the present disclosure, there is provided a display apparatus. The display apparatus includes the above pixel arrangement structure. Thus, the display apparatus includes all features and advantages that the above pixel arrangement structure has, and no redundant descriptions are made herein. Generally, the display apparatus has good display effect.

DETAILED DESCRIPTION OF THE EMBODIMENTS

Figures 1, 2:
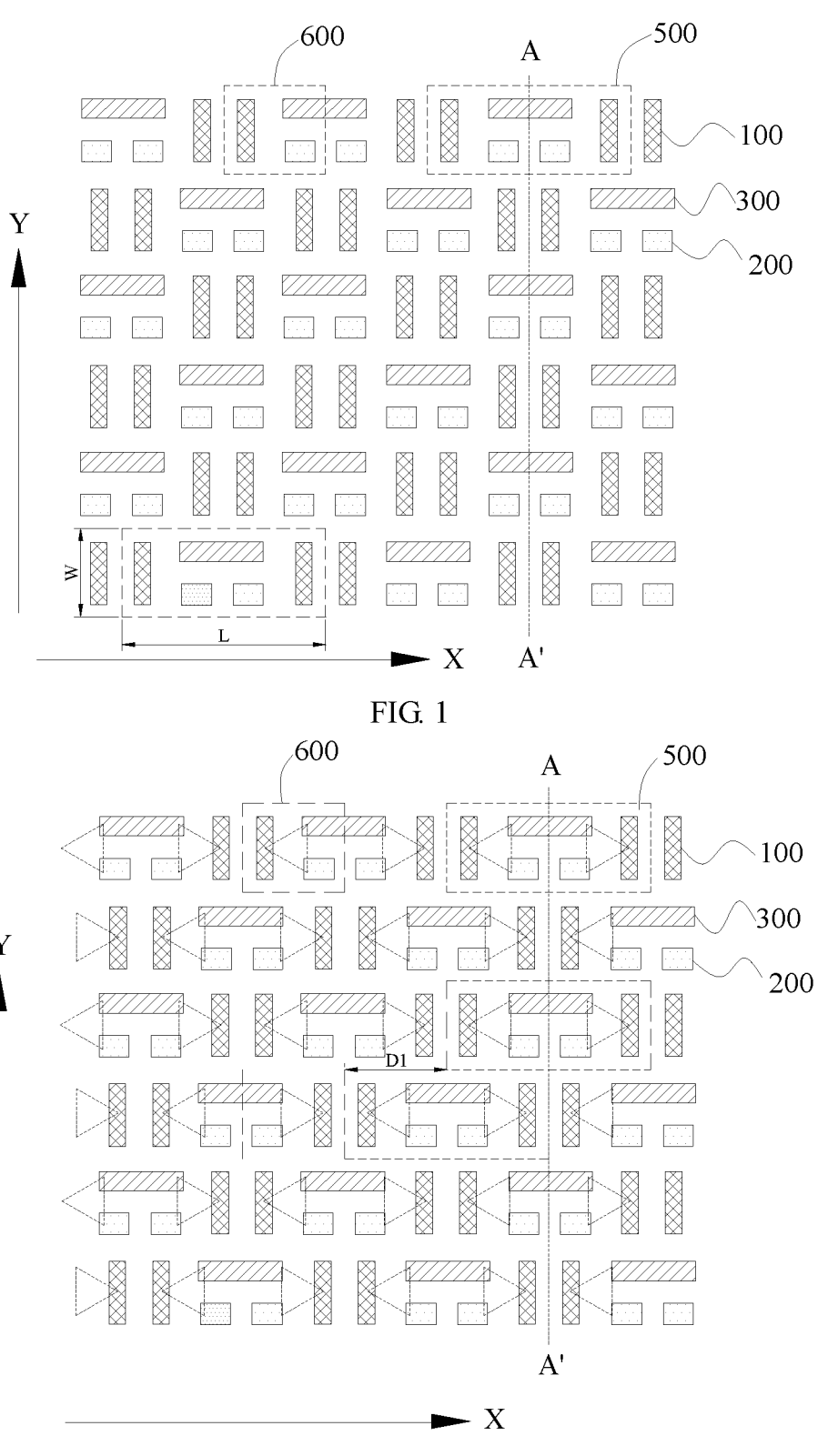
FIG. 1 is a schematic diagram illustrating a pixel arrangement structure according to an embodiment of the present disclosure.
FIG. 2 is a schematic diagram illustrating a pixel arrangement structure according to another embodiment of the present disclosure.

The embodiments of the present disclosure will be detailed with examples of the embodiments illustrated in the accompanying drawings, and same or similar symbols represent same or similar elements or elements with same or similar functions throughout the specification. The embodiments described below by referring to the drawings are merely illustrative and used only to explain the present disclosure and shall not be understood as limiting of the present disclosure.

According to one aspect of the present disclosure, there is provided a pixel arrangement structure. Referring to FIGS. 1 to 6, the pixel arrangement structure includes a plurality of sub-pixel repetition units 500 along a first direction (denoted as X in figures) or a second direction (denoted as y in figures). The plurality of sub-pixel repetition units 500 each form a plurality of pixel units 600. The sub-pixel repetition units 500 each include one or more first color sub-pixels, one or more second color sub-pixels and one or more third color sub-pixels. Each of the first color sub-pixels 100 and each of the second color sub-pixels 200 independently belong to one pixel unit 600 respectively, each of the third color sub-pixels 300 is shared by two pixel units 600, and the first direction X intersects with the second direction Y. In this way, in the pixel arrangement structure, only the one or more third color sub-pixels each are shared by two pixel units based on sub-pixel rendering technology. Such pixel arrangement structures can achieve a high resolution by a reduced physical resolution and can effectively compensate for partial picture loss resulting from fewer sub-pixels, thus helping to improve the display effect.

In some embodiments, the first direction and the second direction may be perpendicular or substantially perpendicular to each other. Being substantially perpendicular means the first direction is approximately perpendicular to the second direction. That an included angle between the first direction and the second direction ranging from 85° to 95° may be deemed that the first direction and the second direction are substantially perpendicular to each other.

In an embodiment of the present disclosure, as shown in FIGS. 1 to 6, each sub-pixel repetition unit 500 includes two first color sub-pixels 100, two second color sub-pixels 200 and one third color sub-pixel 300. Each sub-pixel repetition unit 500 includes two pixel units 600. In each sub-pixel repetition unit 500, the third color sub-pixel 300 is shared by the two pixel units 600 in the sub-pixel repetition unit 500. There is no shared sub-pixel between different sub-pixel repetition units 500. Therefore, each sub-pixel repetition unit includes five sub-pixels, where two first color sub-pixels and two second color sub-pixels do not need to be shared based on sub-pixel rendering technology and one third color sub-pixel is shared by two pixel units. Further, there is no shared sub-pixel between different sub-pixel repetition units. Thus, such pixel arrangement structures can not only further achieve high resolution with a reduced physical resolution but also effectively compensate for partial picture loss resulting from fewer sub-pixels, thus helping improve the display effect.

In the present disclosure, each sub-pixel repetition unit includes two first color sub-pixels, two second color sub-pixels and one third color sub-pixel. The five sub-pixels form two pixel units (pixels), where the third color sub-pixel is shared by the two pixels, that is, a ratio of a density of the first color sub-pixels to a density of the pixels is 1:1, a ratio of a density of the second color sub-pixels to the density of the pixels is 1:1, and a ratio of a density of the third color sub-pixel to the density of the pixels is 1:2. It is to be noted that, in some embodiments of the present disclosure, one sub-pixel includes one effective light-emitting region which is defined by an aperture of a pixel definition layer. Further, The effective light-emitting region is located between opposed anode and cathode along a direction perpendicular to the substrate, and defined by a light-emitting layer that is driven to emit light (those skilled in the art may understand that an organic light-emitting display device includes anodes, cathodes, and light-emitting layers between the anodes and the cathodes). In some other embodiments of the present disclosure, the effective light-emitting region of each sub-pixel may not be defined by an aperture in the pixel definition layer, but for example, may be directly defined by an actual light-emitting region of each sub-pixel. Further, one sub-pixel may only include one effective light-emitting region, or one sub-pixel may include a plurality of effective light-emitting regions and the plurality of effective light-emitting regions are driven by a same pixel circuit (or receive a same drive signal).

It is to be noted that the sub-pixel repetition unit 500 in the present disclosure refers to a smallest repetition unit capable of forming two pixel units 600. FIGS. 1 to 6 only show some possible divisions of some sub-pixel repetition units. Persons skilled in the art understand that there may be some other divisions as long as the above requirements can be satisfied based on sub-pixel rendering technology.

Furthermore, it is noted that FIG. 2 only shows a case that the third color sub-pixel as a virtual pixel is borrowed along the first direction in the present disclosure. Those skilled in the art may adopt a different borrowing manner based on actual situations, for example, the third color sub-pixel is borrowed along the second direction or the like as long as effective display can be achieved. Likewise, FIG. 5 only shows a case that the third color sub-pixel as a virtual pixel is borrowed along the second direction. Those skilled in the art may perform borrowing along the first direction or the like based on actual situations so as to achieve effective display.

According to some embodiments of the present disclosure, an area of one third color sub-pixel may be 1 to 3 times an area of one first color sub-pixel or an area of one second color sub-pixel, that is, a single third color sub-pixel may have the largest area among the sub-pixels, which helps achieve sub-pixel rendering and further improve display effect. In some specific embodiments of the present disclosure, the one or more third color sub-pixels are blue sub-pixels, the one or more first color sub-pixels are red sub-pixels and the one or more second color sub-pixels are green sub-pixels. The blue sub-pixels each are shared by two pixel units based on sub-pixel rendering technology, and an area of one blue sub-pixel is 1 to 3 times an area of one red sub-pixel or an area of a green sub-pixel. Therefore, in the entire display panel, an aperture ratio of the blue sub-pixels is 1 to 3 times an aperture ratio of the red sub-pixels or green sub-pixels. In this way, it helps improve the display effect further.

Figure 3:
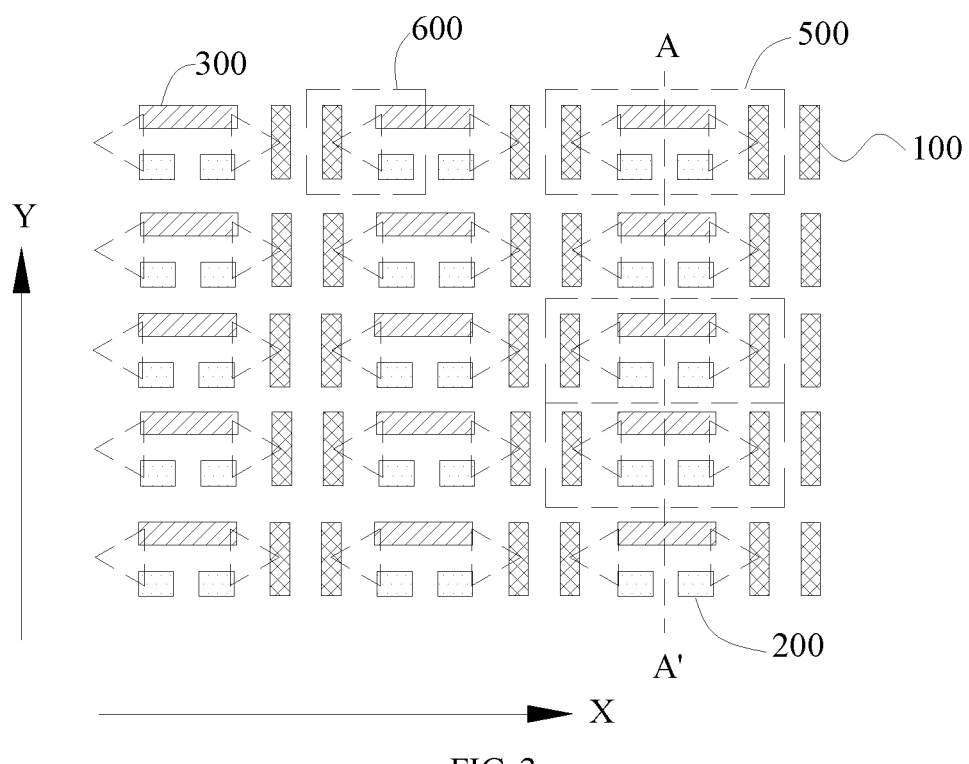
FIG. 3 is a schematic diagram illustrating a pixel arrangement structure according to yet another embodiment of the present disclosure.
Figure 4:
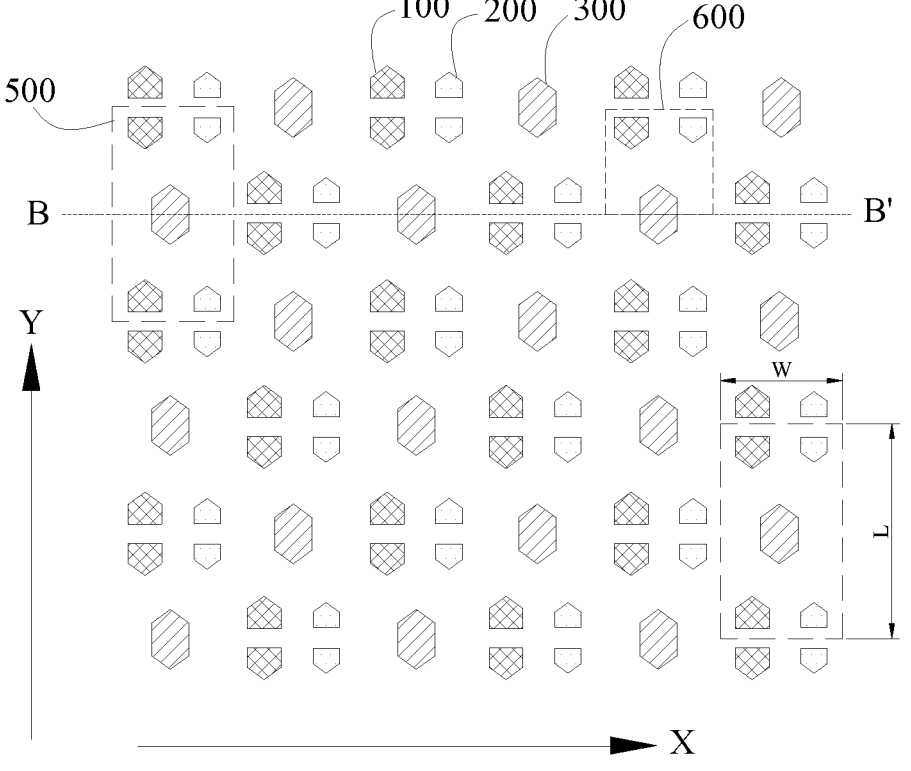
FIG. 4 is a schematic diagram illustrating a pixel arrangement structure according to still another embodiment of the present disclosure.
Figure 5:
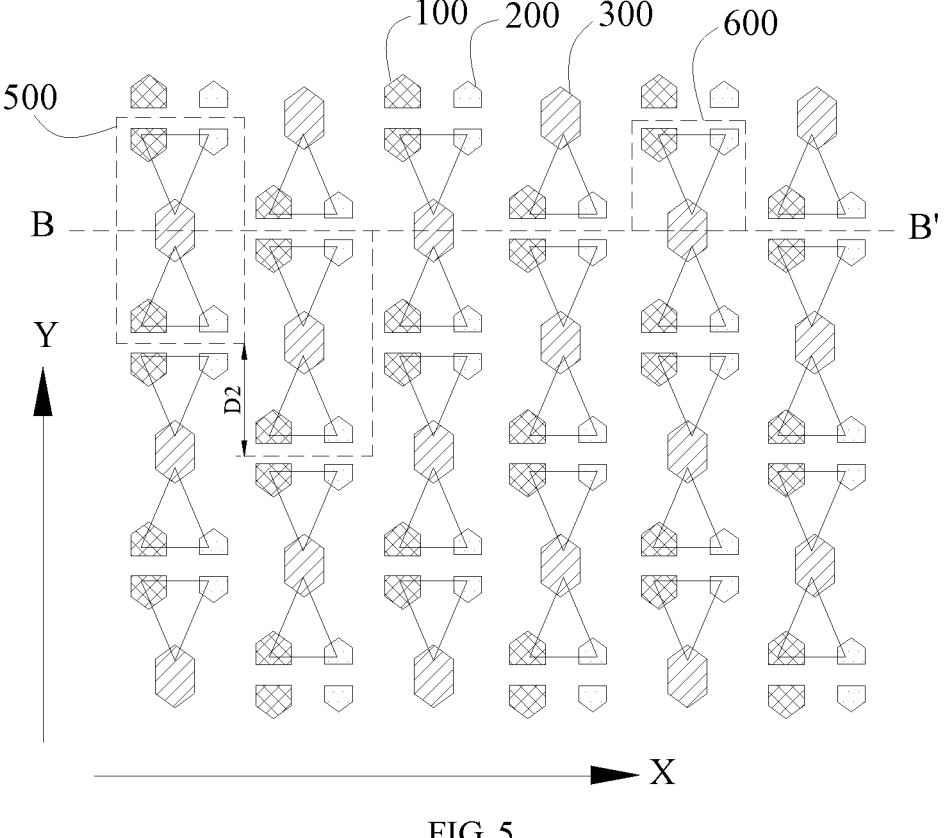
FIG. 5 is a schematic diagram illustrating a pixel arrangement structure according to yet another embodiment of the present disclosure.
Figures 6, 7:
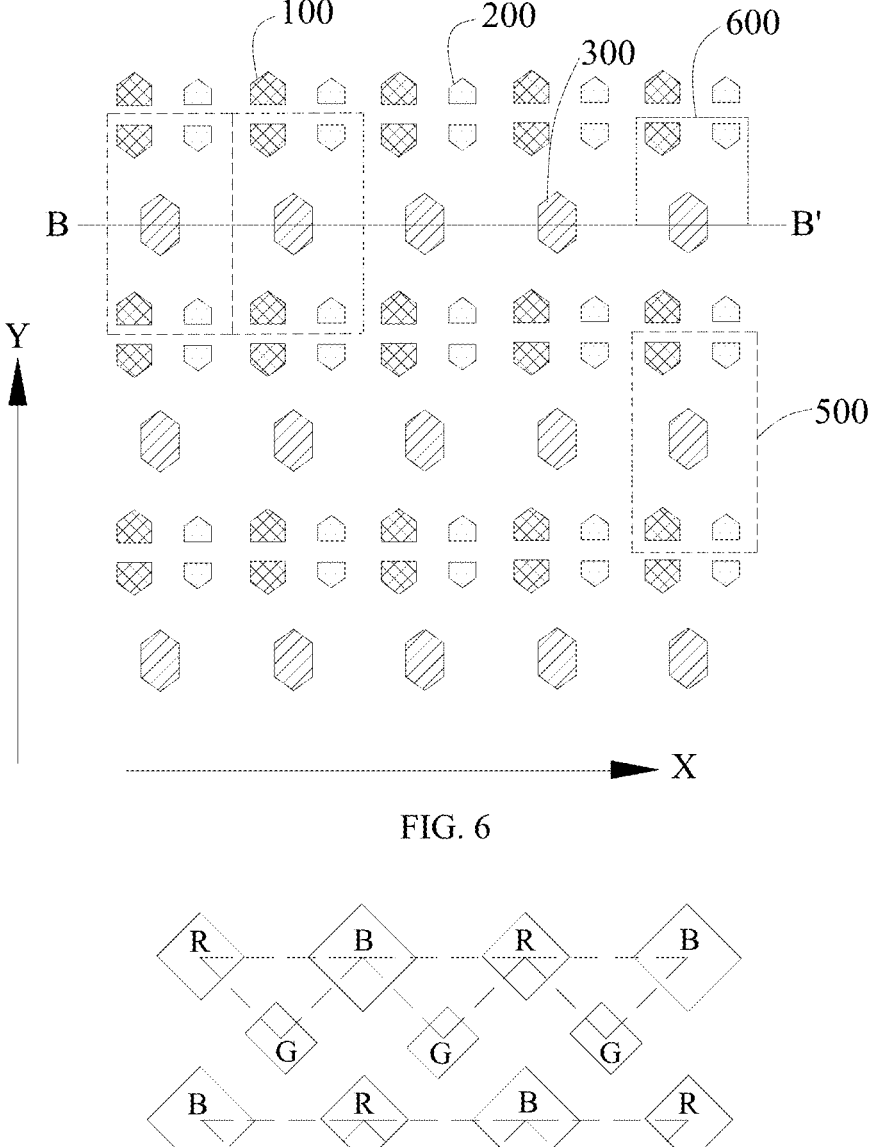
FIG. 6 is a schematic diagram illustrating a pixel arrangement structure according to still another embodiment of the present disclosure.
FIG. 7 is a schematic diagram illustrating a pixel arrangement structure in the prior arts.

In some embodiments of the present disclosure, two pixel units 600 in each sub-pixel repetition unit 500 are in mirror symmetry. In some specific embodiments of the present disclosure, as shown in FIGS. 1 to 3, two pixel units 600 in the sub-pixel repetition units 500 are in mirror symmetry about a first straight line A-A' (i.e. two pixel units 600 in each sub-pixel repetition unit 500 have a symmetrical axis, the first straight line), where the first straight line is parallel to the second direction. It is to be noted that two pixel units 600 in each sub-pixel repetition unit 500 have a symmetrical axis the first straight line and one sub-pixel repetition unit marked by a dotted line box in the figures is exemplified for descriptions. In some specific embodiments of the present disclosure, as shown in FIGS. 4 to 6, two pixel units 600 in the sub-pixel repetition units 500 are in mirror symmetry about a second straight line B-B' (i.e. two pixel units 600 in each sub-pixel repetition unit 500 have a symmetrical axis, the second straight line), where the second straight line is parallel to the first direction. It is to be noted that, two pixel units 600 in each sub-pixel repetition unit 500 have a symmetrical axis the second straight line and one sub-pixel repetition unit marked by a dotted line box in the figures is exemplified for descriptions. In this way, it facilitates the arrangement of sub-pixels, reduces the area of the sub-pixel repetition units and improves the resolution and the display effect.

In one or more embodiments of the present disclosure, there is no special requirement for a distance between two adjacent sub-pixels and the distance can be flexibly selected by persons skilled in the art based on actual situations. In some embodiments, a distance between two adjacent sub-pixels of same color is less than a distance between two adjacent sub-pixels of different colors. Therefore, two adjacent sub-pixels of same color can be evaporated through one aperture in a fine metal mask. It is to be noted that if two sub-pixels of same color are adjacent along the first direction, a distance therebetween is less than a distance between two adjacent sub-pixels of different colors along the first direction; if two sub-pixels of same color are adjacent along the second direction, a distance therebetween is less than a distance between two adjacent sub-pixels of different colors along the second direction. In this case, it facilitates the arrangement of the sub-pixels, and further improves the display effect.

In one or more embodiments of the present disclosure, as shown in FIGS. 1 to 6, the sub-pixel repetition units 500 are rectangles with a size ratio of a length side to a width side being 1.5:1 to 2.5:1. As shown in FIG. 1 or 4, the size of the length side is L and the size of the width side is W, where the ratio of L to W is 1.5:1 to 2.5:1. Thus, it facilitates the arrangement of the sub-pixel repetition units. In some specific embodiments of the present disclosure, the size W of the width side may be 30 to 100 microns such as 30 microns, 40 microns, 50 microns, 60 microns, 70 microns, 80 microns, 90 microns or 100 microns; the size L of the length side may be 45 to 450 microns, such as 45 microns, 60 microns, 75 microns, 80 microns, 90 microns, 100 microns, 120 microns, 140 microns, 150 microns, 160 microns, 180 microns, 200 microns, 220 microns, 240 microns, 250 microns, 260 microns, 270 microns, 300 microns, 320 microns, 350 microns, 360 microns, 380 microns, 390 microns, 400 microns, 420 microns, or 450 microns. In this way, it helps to achieve high PPI and improve the display effect. In one or more embodiments of the present disclosure, as shown in FIGS. 1 to 6, in each sub-pixel repetition unit 500, the third color sub-pixel 300 is located between two first color sub-pixels 100. Thus, it is favorable for formation of the sub-pixel repetition units and reduction of the area of the sub-pixel repetition units.

In one or more embodiments of the present disclosure, a length direction of the third color sub-pixels is consistent with an arrangement direction of two pixel units in the sub-pixel repetition units. As shown in FIGS. 1 to 3, the length direction of the third color sub-pixels 300 is the first direction, and the arrangement direction of two pixel units 600 in the sub-pixel repetition units 500 is also the first direction. As shown in FIGS. 4 to 6, the length direction of the third color sub-pixels 300 is the second direction, and the arrangement direction of two pixel units 600 in the sub-pixel repetition units 500 is also the second direction. Thus, it facilitates the arrangement of the sub-pixels, improves the PPI, and further improves the display effect. Herein, further descriptions are made to the length direction of the sub-pixels. When the sub-pixel is a polygon, its length direction may be a direction corresponding to a line of the longest size which crosses a geometric center of the polygon and is parallel or perpendicular to one side of the polygon. Specifically, when the sub-pixel is a rectangle, its length direction may be a direction corresponding to its length side; when the sub-pixel is a square, its length direction may be a direction corresponding to any one side; when the sub-pixel is a parallelogram, its length direction may be a direction corresponding to any one side if four sides of the parallelogram are same in length, or a direction corresponding to a long side if all four sides of the parallelogram are not same in length; when the sub-pixel is a regular hexagon, its length direction may be a direction of a connection line crossing a center and perpendicular to a pair of parallel sides; when the sub-pixel is a pentagon, its length direction may be a direction of a line perpendicular to one side and connected to an opposite angle; when the sub-pixel is a circle, its length direction may be a direction corresponding to any diameter of the circle; when the sub-pixel is an ellipse, its length direction is a direction corresponding to its major axis. Those skilled in the art may understand that when the shape of the sub-pixel is another shape, its length direction can be determined by a method same as or similar to the above methods.

In one or more embodiments of the present disclosure, the length direction of the third color sub-pixels 300 is parallel to at least one of a length direction of the first color sub-pixels 100 and a length direction of the second color sub-pixels 200, or the length direction of the third color sub-pixels 300 is perpendicular to at least one of the length direction of the first color sub-pixels 100 and the length direction of the second color sub-pixels 200. In some specific embodiments of the present disclosure, as shown in FIGS. 1 to 3, the length direction of the third color sub-pixels 300 (the first direction) is parallel to the length direction of the second color sub-pixels 200 (the first direction), and perpendicular to the length direction of the first color sub-pixels 100 (the second direction). In some other specific embodiments of the present disclosure, as shown in FIGS. 4 to 6, the length direction of the third color sub-pixels 300 (the second direction) is parallel to the length direction of the second color sub-pixels 200 (the second direction), and parallel to the length direction of the first color sub-pixels 100 (the second direction). In this way, the preparation process of the sub-pixels can be simplified.

In some specific embodiments of the present disclosure, as shown in FIG. 2, the sub-pixel repetition units 500 are arranged along the first direction. A size of one pixel unit 600 along the first direction is D1 and two sub-pixel repetition units 500 that are adjacent along the second direction are staggered/misaligned with a misaligned distance being 0 to D1 (where FIG. 3 shows a structural schematic diagram of pixel arrangement structures with zero misalignment, and FIG. 2 shows a structural schematic diagram of pixel arrangement structures with a misalignment distance of D1). In some other embodiments of the present disclosure, as shown in FIG. 5, the sub-pixel repetition units 500 are arranged along the second direction. A size of one pixel unit 600 along the second direction is D2 and two sub-pixel repetition units 500 that are adjacent along the first direction are staggered/misaligned by a misaligned distance being 0 to D2 (where FIG. 6 shows a structural schematic diagram of pixel arrangement structures with zero misalignment, and FIG. 5 shows a structural schematic diagram of pixel arrangement structures with a misalignment distance of D2). Therefore, it facilitates the arrangement of the sub-pixels and improves the display effect.

It is to be noted that, in FIG. 2, the size D1 of one pixel unit 600 along the first direction is half of the size L of the length side of one sub-pixel repetition unit 500, whereas, in FIG. 5, the size D2 of one pixel unit 600 along the second direction is half of the size L of the length side of one sub-pixel repetition unit 500. That is, D1 and D2 each are half of the L, namely, D1 and D2 may be 22.5 to 125 microns respectively, such as 22.5 microns, 25 microns, 30 microns, 40 microns, 50 microns, 60 microns, 70 microns, 80 microns, 90 microns, 100 microns, 110 microns, 115 microns, 120 microns or 125 microns.

In some specific embodiments of the present disclosure, as shown in FIGS. 1 to 3, in the sub-pixel repetition units 500 arranged along the first direction (the third color sub-pixel 300 is shared by the two pixel units in each of the sub-pixel repetition units 500 as shown in FIG. 2), two second color sub-pixels 200 are located between two first color sub-pixels 100, and two second color sub-pixels 200 are disposed side by side along the first direction. Thus, it helps to reduce the area of the sub-pixel repetition units, and improve the resolution and the display effect. Further, the two second color sub-pixels disposed side by side may be formed through one aperture in a FMM, which simplifies a process of fabricating the FMM for forming the pixel arrangement structure through evaporation, thus helping lower production costs and improve product yield.

In some specific embodiments of the present disclosure, as shown in FIGS. 1 to 3, the third color sub-pixel 300 and two second color sub-pixels 200 are arranged along the second direction, that is, the third color sub-pixel 300 and two second color sub-pixels 200 are arranged top and bottom/up and down along the second direction. Thus, it helps to further improve the resolution and the display effect.

In one or more embodiments of the present disclosure, as shown in FIGS. 1 to 3, two first color sub-pixels 100 in two adjacent sub-pixel repetition units 500 along the first direction are disposed adjacent to each other. Thus, it is favorable for reducing the area of the sub-pixel repetition units and improving the resolution and the display effect. Furthermore, two adjacent first color sub-pixels 100 in two adjacent sub-pixel repetition units 500 may be formed through one FMM aperture, which helps to simplify the process of fabricating an aperture for forming two first color sub-pixels in the FMM, thus reducing the costs and improving the product yield.

In one or more embodiments of the present disclosure, as shown in FIGS. 4 to 6, in the sub-pixel repetition units 500 arranged along the second direction (the third color sub-pixel 300 is shared by the two pixel units in each of the sub-pixel repetition units 500, as shown in FIG. 5), the third color sub-pixels 300 are located between two second color sub-pixels 200. In this way, it is favorable for reducing the area of the sub-pixel repetition units and improving the resolution and the display effect.

In one or more embodiments of the present disclosure, as shown in FIGS. 4 to 6, two first color sub-pixels 100 along the second direction are located in a first sub-pixel column, two second color sub-pixels 200 along the second direction are located in a second sub-pixel column, and the third color sub-pixels 300 are located between the first sub-pixel column and the second sub-pixel column. Namely, along the second direction, the first color sub-pixels and the second color sub-pixels are located in different sub-pixel columns whereas the third color sub-pixels are located between the two sub-pixel columns. In this way, it is favorable for reducing the area of the sub-pixel repetition units and improving the resolution and the display effect.

In one or more embodiments of the present disclosure, as shown in FIGS. 4 to 6, in each sub-pixel repetition unit 500, the first color sub-pixel 100 and the second color sub-pixel 200 at a same side of the third color sub-pixel 300 are located in a same sub-pixel row. Therefore, it helps to achieve the display effect of higher resolution based on the sub-pixel rendering technology and helps to further reduce the area of the sub-pixel repetition units and improve the resolution and the display effect.

It is to be noted that, the rows and the columns in the present disclosure should be understood in a broad sense, that is, the rows and the columns can be exchanged, for example, the rows can be changed into the columns or the columns can be changed into the rows by 90-degree rotation.

In some specific embodiments of the present disclosure, the first color sub-pixels are red sub-pixels, the second color sub-pixels are green sub-pixels, and the third color sub-pixels are blue sub-pixels. Therefore, each sub-pixel repetition unit includes two red sub-pixels, two green sub-pixels and one blue sub-pixel. The blue sub-pixel is shared based on the sub-pixel rendering technology. Further, two pixel units are formed in each sub-pixel repetition unit to display a picture of various colors. Those skilled in the art may understand that the first color sub-pixels, the second color sub-pixels and the third color sub-pixels in the present disclosure may also be other pixel combinations, for example, G/R/B, R/B/G B/R/G G/B/R or B/G/R.

In the present disclosure, there is no special limitation to the shapes of the sub-pixels of different colors, and persons skilled in the art can select and design the shapes based on actual needs. In some specific embodiments of the present disclosure, the first color sub-pixels, the second color sub-pixels and the third color sub-pixels may have the shapes of rectangle, diamond, pentagon, hexagon, circle, ellipse or the like.

It is to be noted that, the specific shapes and positional relationship of the sub-pixels in the present disclosure may be designed by those skilled in the art based on needs. In practical processes, due to limitations of process conditions or influence of other factors, there may be some error. The shapes and the positional relationship and the like of the sub-pixels shall fall within the scope of the pixel arrangement structure provided by the embodiments of the present disclosure as long as they can substantially satisfy the conditions of the present disclosure.

Figure 8:
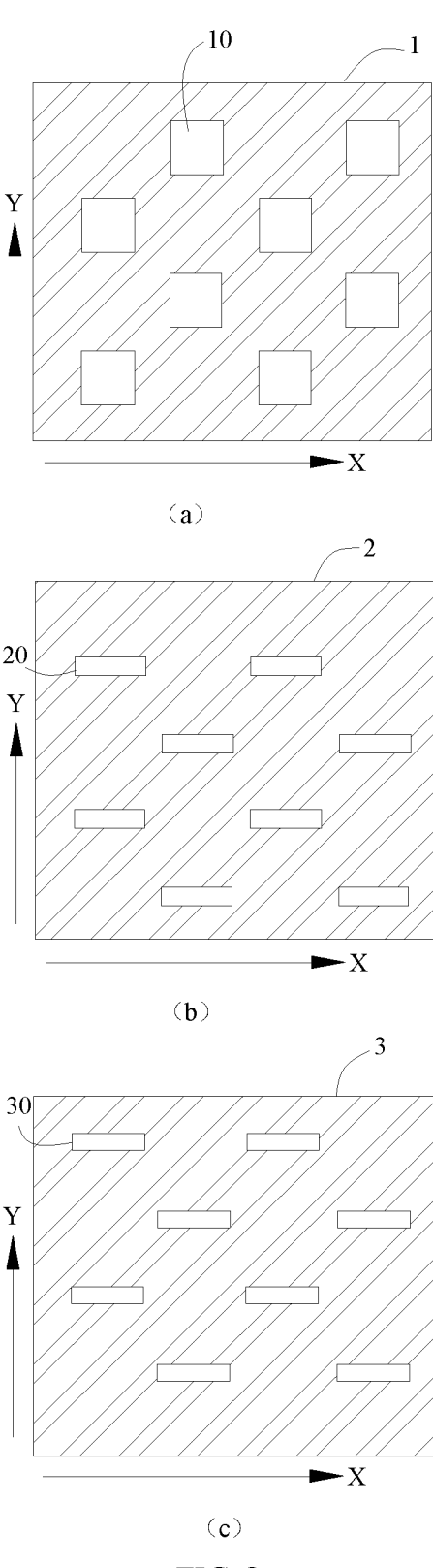
FIG. 8 is a structural schematic diagram illustrating a fine metal mask set according to an embodiment of the present disclosure.
Figure 9:
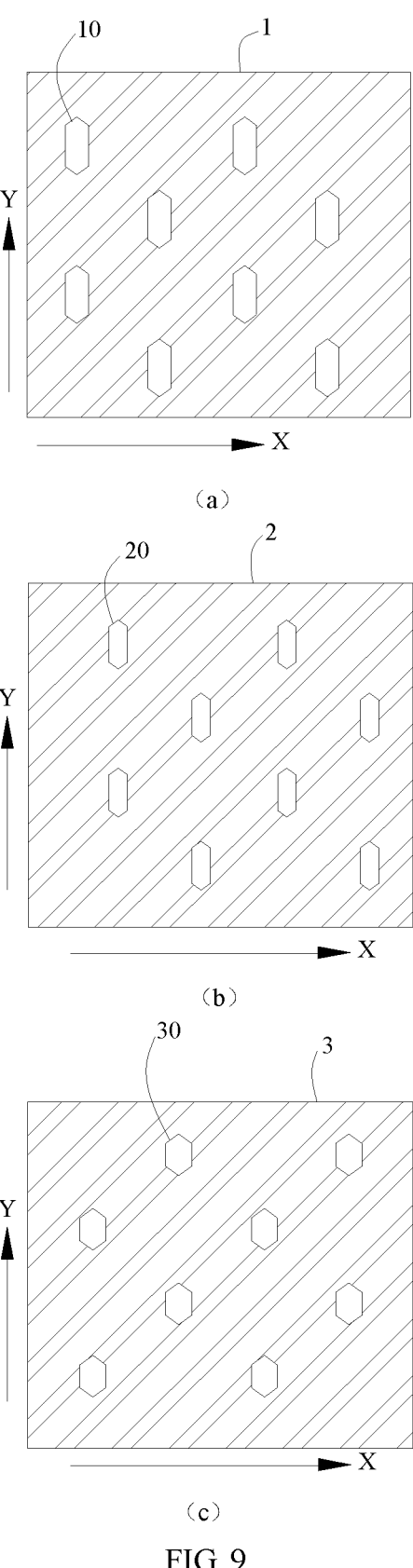
FIG. 9 is a structural schematic diagram illustrating a fine metal mask set according to another embodiment of the present disclosure.

According to another aspect of the present disclosure, there is provided a fine metal mask set/kit for preparing the above pixel arrangement structure. As shown in FIGS. 8 and 9, the fine metal mask set includes a first fine metal mask 1 (referring to the FIG. (a) of FIG. 8 and FIG. (a) of FIG. 9), a second fine metal mask 2 (referring to the FIG. (b) of FIG. 8 and FIG. (b) of FIG. 9), and a third fine metal mask 3 (referring to the FIG. (c) of FIG. 8 and FIG. (c) of FIG. 9). The first fine metal mask 1 has a plurality of first apertures 10 for forming the first color sub-pixels through evaporation, and each of the first apertures 10 forms two first color sub-pixels through evaporation; the second fine metal mask 2 has a plurality of second apertures 20 for forming the second color sub-pixels through evaporation, and each of the second apertures 20 forms two second color sub-pixels through evaporation; the third fine metal mask 3 has a plurality of third apertures 30 for forming the third color sub-pixels through evaporation. Thus, the above pixel arrangement structure can be easily prepared using the fine metal masks.

The fine metal mask (FMM) functions to deposit organic light-emitting materials of different colors to form light-emitting pixel points in a production process of an organic light-emitting display panel and the apertures of the fine metal mask directly determine the resolution of the organic light-emitting display panel. Namely, the smaller the aperture is, the smaller the area of the single sub-pixel is, the smaller the area of the formed light-emitting pixel point is, and the higher the resolution of the display panel is. But, the production yield of the fine metal masks with small apertures is relatively low, which directly results in significantly-increased manufacturing difficulty of the fine metal masks and significantly-increased manufacturing costs. Further, in the subsequent evaporation process to form the sub-pixels, an increased process accuracy is required accordingly, which is unfavorable for simplification of process flow and decrease of manufacturing costs. When an area of an aperture for forming a particular sub-pixel can correspond to an area of two or more of such sub-pixels, two or more of such pixels can be formed through evaporation by using one sub-pixel aperture, and thus the process difficulty of manufacturing the fine metal masks will be obviously reduced. Furthermore, the sub-pixels can be defined and separated by a pixel definition layer on a display substrate. Hence, during an evaporation process, no higher process accuracy is required to deposit corresponding organic light-emitting materials onto corresponding positions.

In some embodiments of the present disclosure, as shown in FIG. 8, when forming the sub-pixel repetition units arranged along the first direction, two second color sub-pixels in each sub-pixel repetition unit are formed through one second aperture 20 (refer to FIG. (b) of FIG. 8); two adjacent first color sub-pixels in two adjacent sub-pixel repetition units are formed through one first aperture 10 (refer to FIG. (a) of FIG. 8). Furthermore, each third color sub-pixel is formed by evaporation through one third aperture 30 (refer to FIG. (c) of FIG. 8). Therefore, the fine metal mask set can be formed with a significantly-increased yield in a simple process. In this way, the number of sub-pixels can be reduced and the process of forming the pixel arrangement structure can be simplified. When the formed pixel arrangement structure is applied to a display apparatus, the display apparatus has good display effect.

In some other embodiments of the present disclosure, as shown in FIG. 9, when forming the sub-pixel repetition units arranged along the second direction, two adjacent first color sub-pixels in two adjacent sub-pixel repetition units are formed through one first aperture 10 (refer to FIG. (a) of FIG. 9), and two adjacent second color sub-pixels in two adjacent sub-pixel repetition units are formed through one second aperture (refer to FIG. (b) of FIG. 9). Furthermore, each third color sub-pixel is formed by evaporation through one third aperture 30 (refer to FIG. (c) of FIG. 9). Hence, the fine metal mask set can be formed with a significantly-increased yield in a simple process. In this way, the number of sub-pixels can be reduced and the process of forming the pixel arrangement structure can be simplified. When the formed pixel arrangement structure is applied to a display apparatus, the display apparatus has good display effect.

The shape of apertures in each fine metal mask of the fine metal mask set and the shape of the sub-pixels are not specially limited and persons skilled in the art may perform selection and designing based on actual needs. In some specific embodiments of the present disclosure, the shape of the apertures in the fine metal masks and the shape of the sub-pixels may be rectangle. When the sub-pixels are rectangular, the fine metal masks are also rectangular, so as to increase the number of the sub-pixels deposited in each aperture and further improve the utilization rate of the apertures of the fine metal masks. Further, the rectangular fine metal masks can be manufactured relatively easily with a high yield.

According to another aspect of the present disclosure, there is provided a display apparatus. The display apparatus includes the pixel arrangement structure mentioned above. Hence, the display apparatus has all features and advantages that the above pixel arrangement structure has and thus no redundant descriptions are made herein. Generally, the display apparatus can achieve good display effect based on sub-pixel rendering technology.

In the descriptions of the present disclosure, the orientations or positional relationships indicated by the terms "first direction", "second direction", "up" and "down" etc. are based on the orientations or positional relationships shown in drawings, with the purpose of only describing the present disclosure rather than requiring the present disclosure to be constructed or operated in a specific orientation and thus shall not be understood as limiting of the present disclosure.

In the descriptions of the specification, the reference terms "embodiment", "one embodiment", "another embodiment", "some embodiments", "some specific embodiments", and "some other specific embodiments" etc. are intended to mean that the specific features, structures, materials or characteristics described in combination with the embodiments are included in at least one embodiment of the present disclosure. In the specification, the illustrative expressions for the above terms do not necessarily refer to the same embodiments or examples. Furthermore, the described specific features, structures, materials or characteristics can be combined in an appropriate way in any one or more embodiments or examples. Further, in a case of no conflicts, those skilled in the art can perform combination for the different embodiments or examples and the features of the different embodiments or examples described in the specification. In addition, it is to be noted that in the specification, the terms "first", "second" and "third" are used only for the purpose of descriptions and shall not be understood as indicating or implying relative importance or implicitly indicating the number of the indicated technical features.

Although the embodiments of the present disclosure have been described as above, it can be understood that the above embodiments are only illustrative and shall not be understood as limiting of the present disclosure. Those skilled in the art can perform changes, modifications, substitutions or variations to the above embodiments within the scope of the present disclosure.

The invention claimed is:

1. A pixel arrangement structure, comprising a plurality of sub-pixel repetition units along a first direction or a second direction, the plurality of sub-pixel repetition units each forming a plurality of pixel units, the sub-pixel repetition units each comprising one or more first color sub-pixels, one or more second color sub-pixels and one or more third color sub-pixels, wherein each of the first color sub-pixels and each of the second color sub-pixels independently belong to one pixel unit respectively, each of the third color sub-pixels is shared by two of the pixel units, wherein the first direction intersects with the second direction;

wherein the sub-pixel repetition units are rectangular with a size ratio of a length side to a width side being 1.5:1 to 2.5:1;

wherein a size of the width side is 30 to 100 microns and a size of the length side is 45 to 250 microns.

2. The pixel arrangement structure of claim 1, wherein one of the following conditions is satisfied:

a size of one pixel unit along the first direction is D1, and two sub-pixel repetition units that are adjacent along the second direction are misaligned with a misaligned distance being 0 to D1; or, a size of one pixel unit along the second direction is D2, and two sub-pixel repetition units that are adjacent along the first direction are misaligned with a misaligned distance being 0 to D2.

3. The pixel arrangement structure of claim 1, wherein an area of one third color sub-pixel is 1 to 3 times an area of one first color sub-pixel or an area of one second color sub-pixel.

4. The pixel arrangement structure of claim 1, wherein a length direction of the third color sub-pixels is consistent with an arrangement direction of the pixel units in the sub-pixel repetition units.

5. The pixel arrangement structure of claim 1, wherein a length direction of the third color sub-pixels is parallel to at least one of a length direction of the first color sub-pixels and a length direction of the second color sub-pixels, or the length direction of the third color sub-pixels is perpendicular to at least one of the length direction of the first color sub-pixels and the length direction of the second color sub-pixels.

6. The pixel arrangement structure of claim 1, wherein each of the sub-pixel repetition units comprises two first color sub-pixel, two second color sub-pixels and one third color sub-pixel, and each of the sub-pixel repetition units comprises two pixel units, wherein the third color sub-pixel in each of the sub-pixel repetition units is shared by the two pixel units, and there is no shared sub-pixel between different sub-pixel repetition units;

wherein in each of the sub-pixel repetition units arranged along the second direction, the third color sub-pixel is located between the two second color sub-pixels.

7. The pixel arrangement structure of claim 6, wherein the two pixel units in each of the sub-pixel repetition units are in mirror symmetry.

8. The pixel arrangement structure of claim 1, wherein a distance between two adjacent sub-pixels of same color is shorter than a distance between two adjacent sub-pixels of different colors.

9. The pixel arrangement structure of claim 1, wherein, in each of the sub-pixel repetition units, each of the third color sub-pixels is located between two of the first color sub-pixels.

10. The pixel arrangement structure of claim 6, wherein in each of the sub-pixel repetition units arranged along the first direction, the two second color sub-pixels are located between the two first color sub-pixels, and the two second color sub-pixels are disposed side by side along the first direction.

11. The pixel arrangement structure of claim 10, wherein the third color sub-pixel and the two second color sub-pixels are arranged top and bottom along the second direction.

12. The pixel arrangement structure of claim 10, wherein, along the first direction, two first color sub-pixels in two adjacent sub-pixel repetition units are disposed adjacent to each other.

13. The pixel arrangement structure of claim 6, wherein in each of the sub-pixel repetition units arranged along the second direction, the third color sub-pixel is located between the two second color sub-pixels.

14. The pixel arrangement structure of claim 13, wherein the two first color sub-pixels are located in a first sub-pixel column along the second direction, the two second color sub-pixels are located in a second sub-pixel column along the second direction, and the third color sub-pixel is located between the first sub-pixel column and the second sub-pixel column.

15. The pixel arrangement structure of claim 14, wherein, in each of the sub-pixel repetition units, the first color sub-pixel and the second color sub-pixel at a same side of the third color sub-pixel are located in a same sub-pixel row.

16. The pixel arrangement structure of claim 1, wherein the one or more first color sub-pixels are red sub-pixels, the one or more second color sub-pixels are green sub-pixel, and one or more the third color sub-pixels are blue sub-pixels.

17. A display apparatus, comprising the pixel arrangement structure according to claim 1 and a driving circuit.

\* \* \* \* \*